United States Patent [19]
Lee et al.

[11] Patent Number: 4,686,468
[45] Date of Patent: Aug. 11, 1987

[54] CONTACT SET FOR TEST APPARATUS FOR TESTING INTEGRATED CIRCUIT PACKAGE

[75] Inventors: Kenneth R. Lee, Lincoln; Ernest L. Kallander, Jr., Southboro, both of Mass.

[73] Assignee: Aseco Corporation, Marlboro, Mass.

[21] Appl. No.: 679,911

[22] Filed: Dec. 10, 1984

[51] Int. Cl.[4] .................. G01R 31/26; H05K 7/02
[52] U.S. Cl. ........................ 324/158 F; 439/68
[58] Field of Search ........... 324/158 F, 158 P, 73 PC; 339/17 C, 17 CF, 17 F, 45 R; 174/52 FP; 206/328; 361/398

[56] References Cited

U.S. PATENT DOCUMENTS

| 3,325,691 | 6/1967 | Dahlgren et al. | 361/398 |
| 3,652,974 | 3/1972 | Tems | 324/158 F X |
| 4,018,491 | 4/1977 | Niedzwiecke et al. | 339/17 CF X |
| 4,472,876 | 9/1984 | Nelson | 174/52 FP X |
| 4,554,505 | 11/1985 | Zachry | 324/158 F |

FOREIGN PATENT DOCUMENTS

| 0022570 | 2/1982 | Japan | 324/158 F |
| 1209901 | 10/1970 | United Kingdom | 174/52 FP |

OTHER PUBLICATIONS

Scrupski, S., "Plastic-Ceramic . . . ", Electronics, Apr. 12, 1971, pp. 75-86.

Primary Examiner—Reinhard J. Eisenzopf
Assistant Examiner—Stephen M. Baker
Attorney, Agent, or Firm—Cesari and McKenna

[57] ABSTRACT

A planar contact set for use in a test fixture for receiving an integrated circuit package for facilitating the electrical connection thereof to test equipment so that electrical and electronic tests can be performed on the integrated circuit. The contact set includes a flexible insulating support member having a central aperture which supports a plurality of conductive contact strips which extend over the aperture in cantilever fashion. The support member includes a support sheet underlying the contact strips and a retaining sheet overlying the contact strips, the sheets maintaining the strips in the proper position to contact the leads of the integrated circuit package when in a test registration position and also to enable electrical connections to be made to the test apparatus. In an exemplary test fixture, the contact member is supported between a lower support and an upper guide member, the guide member having a guide aperture over the central aperture of the contact member's support sheet to expose the contact strips. A ram holding an integrated circuit package lowers it through the guide aperture to an advanced test position with the leads extending from the integrated circuit package in electrical contact with the contact strips. At the end of a test, the ram retracts to remove the integrated circuit package. A mechanical ejector is provided to help force the package from the test position in the fixture if the ram is unable to remove it.

3 Claims, 4 Drawing Figures

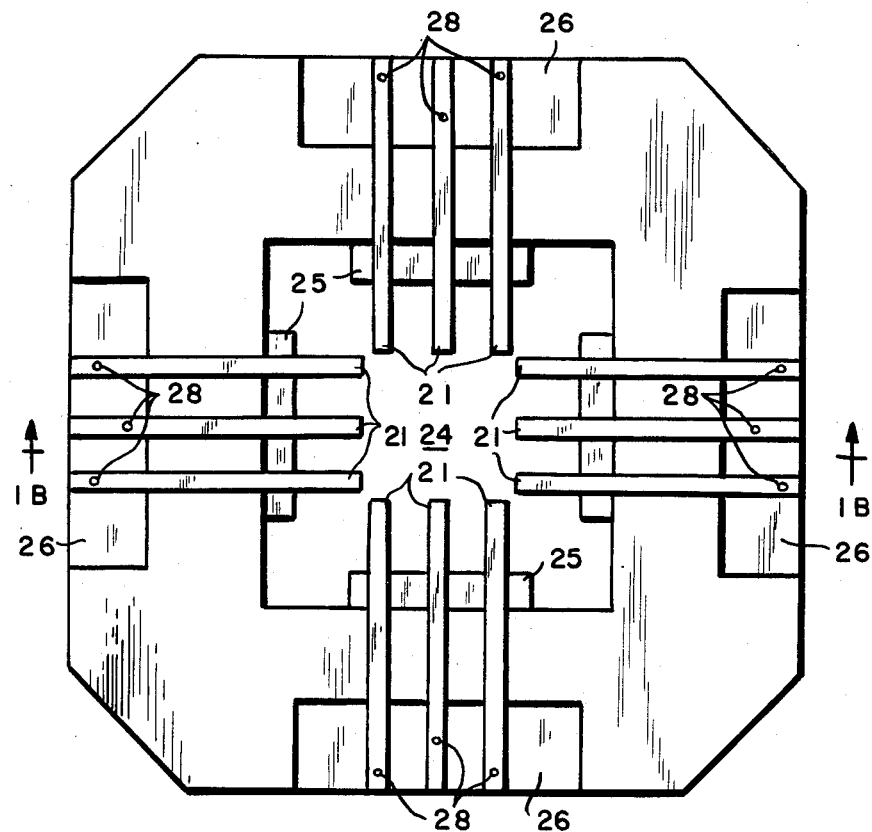
FIG. IA
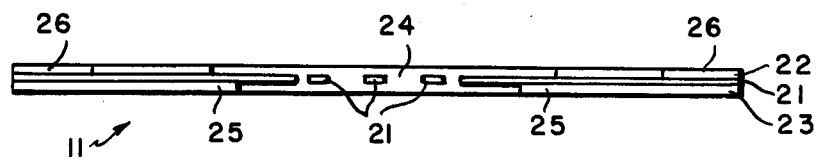
FIG. IB

CONTACT SET FOR TEST APPARATUS FOR TESTING INTEGRATED CIRCUIT PACKAGE

FIELD OF THE INVENTION

The invention relates generally to the field of test apparatus for performing electrical and electronic tests on integrated circuits, and more specifically to contact sets for use in test fixtures in such apparatus, the contact sets facilitating making connections to the integrated circuits to allow the tests to be performed.

BACKGROUND OF THE PRIOR ART

After an integrated circuit package is manufactured, it must be tested to determine if it works electrically and electronically. Integrated circuit test fixtures typically have a contact set comprising aplurality of contact strips that extend upwardly from a base member and comprise the leads which connect the leads of the package to electrical testing equipment in the test apparatus. Typically, the strips have free ends which are bent to form flat contact areas. A ram picks up an integrated circuit package and places it in test registration against the contact areas of the contact strips, thereby connecting the integrated circuit to the testing equipment and allowing the test to be performed.

The prior integrated circuit testers have a number of deficiencies. In some of these, the contact strips in the contact sets used in the fixtures must be individually aligned, which is a difficult and time-consuming operation requiring skilled personnel. If a single strip breaks or is bent out of the test registration position, the entire alignment operation must be performed. As a result of the configuration of the contact strips, that is, cantilevered upwardly and with a bend at the tip where contact is made, and the forces of contact caused by the ram, the lifetime of the contact strips is relatively short, and so the lengthy repair operation noted above must be performed relatively often. In addition, if it is desired to test packages having differing lead configurations, the lengthy replacement process must be performed to provide contact sets having the correct orientations. Furthermore, the contact strips in the contact sets in prior test fixtures typically have relatively long lengths, which, in turn, causes them to have relatively high capacitances and inductances thereby limiting their high-frequency test capability.

SUMMARY OF THE INVENTION

The invention provides a new and improved contact set for use in a test fixture for receiving integrated circuit packages and for providing electrical contact with the leads thereof to allow for electrical and electronic testing of the integrated circuit.

In brief summary, the invention includes a planar contact set including a support sheet, the surface of which supports a plurality of conductive contact strips coplanar with the support sheet. The support sheet has a central aperture which defines the test position, the integrated circuit package being inserted into the central aperture. The contact strips extend, in cantilever fashion, over the edge of the central aperture. The central aperture is dimensioned, and the contact strips are so oriented and positioned, that, when the contact set is placed in a test fixture and an integrated circuit package mounted thereon for test, the integrated circuit package will generally fit into the aperture and its leads will contact the portions of the contact strips extending into the central aperture.

In one embodiment, the support sheet is resilient, and includes a lower support member which supports the contact strips from below and an upper retaining member which covers and retains the contact strips outside of the area of the central aperture. Test contact notches are also formed in the upper sheet member to allow contact to be made to the test equipment.

With the new contact set, the contact strips can be relatively easily formed using etching techniques similar to techniques for forming printed circuit board traces. When mounting the contact set on a test fixture, no manual contact strip alignment typical of the prior contact sets is required. Accordingly, the invention allows contact sets to be quickly replaced, resulting in reduced down time of the test apparatus. Furthermore, the configuration of the contact strips included in the new contact set allows for a larger contact strip life time, further reducing the down time of the test apparatus. In addition, the invention allows a reduction in the length of the contact strips, resulting in a lower capacitance and inductance and enhanced high-frequency test capability of the contact set.

The invention also provides a new test fixture for receiving and supporting the contact set. The test fixture includes a guide for guiding the integrated circuit packages into the test registration position in the central aperture of the contact set. One embodiment of the fixture includes an ejector member which can provide a mechanical ejection of the integrated circuit package if the ram is unable to remove it, and connectors around its periphery for allowing electrical connection of the test apparatus to the contact set.

BRIEF DESCRIPTION OF THE DRAWINGS

The invention will be set forth with particularity in the appended claims. The above and further advantages of the invention will be made clear by referring to the following detailed description of an illustrative embodiment taken in conjunction with the accompanying drawings, in which:

FIGS. 1A and 1B are top and sectional views, respectively, of the new contact set constructed in accordance with the invention.

DETAILED DESCRIPTION OF AN ILLUSTRATIVE EMBODIMENT

Figure 2B:
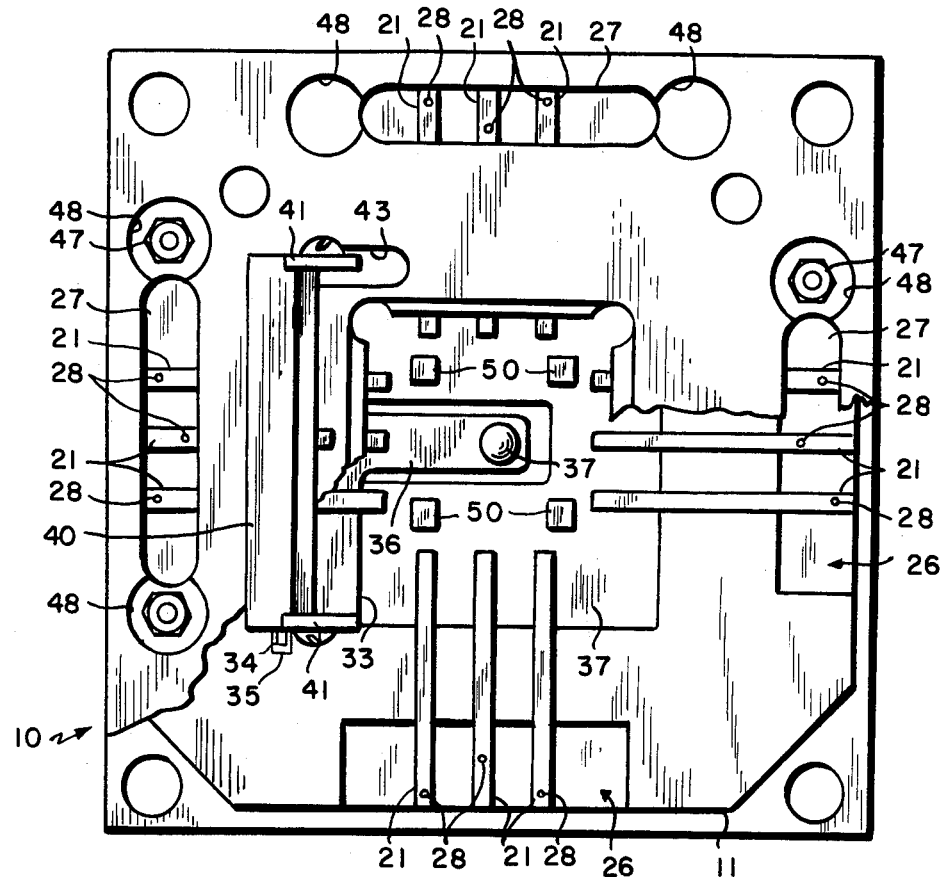
FIGS. 2A and 2B are side elevational and top views, respectively, partially in section, of a test fixture for receiving and supporting the contact set depicted receiving integrated circuit packages and providing electrical connections to the leads thereof for electrical and electronic testing.

With reference to FIGS. 1A and 1B, a contact set 11 constructed in accordance with the invention includes a plurality of planar contact strips 21 sandwiched between upper and lower sheet members 22 and 23, respectively, of a sheet material. In one embodiment, a resilient insulating material such as Kapton is used as the sheet material for sheet members 22 and 23. The upper and lower sheet members both have a rectangular central aperture identified by the reference numeral 24, and the lower sheet member includes a plurality of tongues 25 extending slightly over the central aperture and under the contact strips. The contact strips extend in cantilever fashion over the tongues 25 and into the area of aperture 24.

The upper sheet member 22 also includes a plurality of generally rectangular test access notches 26 formed in its outer edge to expose the ends of the contact strips near the outer periphery of contact set 11 to permit test connectors to be connected to the contact strips 21 when the contact set 11 is in use. The contact strips 21 may be provided with pin holes 28 in the regions exposed by notches 26 to accommodate pins of the test connectors if necessary. It will be appreciated by those skilled in the art that the configuration of the contact strips 21, aperture 24, tongues 25, notches 26, and pin holes 28 will depend on the shapes of the integrated circuit packages to be tested and the configuration of the leads extending therefrom.

The contact strips may be formed from a single sheet of conductive material which is etched to form the desired contact strip pattern. During the etching process, the pattern of the etch may be such as to leave the contact strips supported by an outer contact frame (not shown) formed of the sheet material, which can later be removed after the contact set is completed. The layers of the insulating material which form sheet members 22 and 23 are then applied to the upper and lower surfaces of the formed contact strips. After the contact frame is removed, the resulting contact set can be mounted into a test fixture, such as the one described below in connection with FIGS. 2A and 2B.

The new contact set provides a number of advantages over the contact sets provided in the prior art. In the new contact set, the contact strips can be much shorter than in the prior art, which reduces the additional capacitance and inductance provided by the contact set and enhances the high-frequency test capability. The new contact set is easier to form than prior contact sets, and may be replaced more quickly than prior contact sets, resulting in reduced down time. Furthermore, the replacement operation does not require alignment of the contact strips to ensure registration with the integrated circuit leads, as is required in the prior art; and so less skill is required to perform the replacement. Providing all of the contact strips in a single plane and supported near the test position by the support sheet members minimizes the likelihood of any of the strips being forced out of the required test registration position.

Figure 2A:
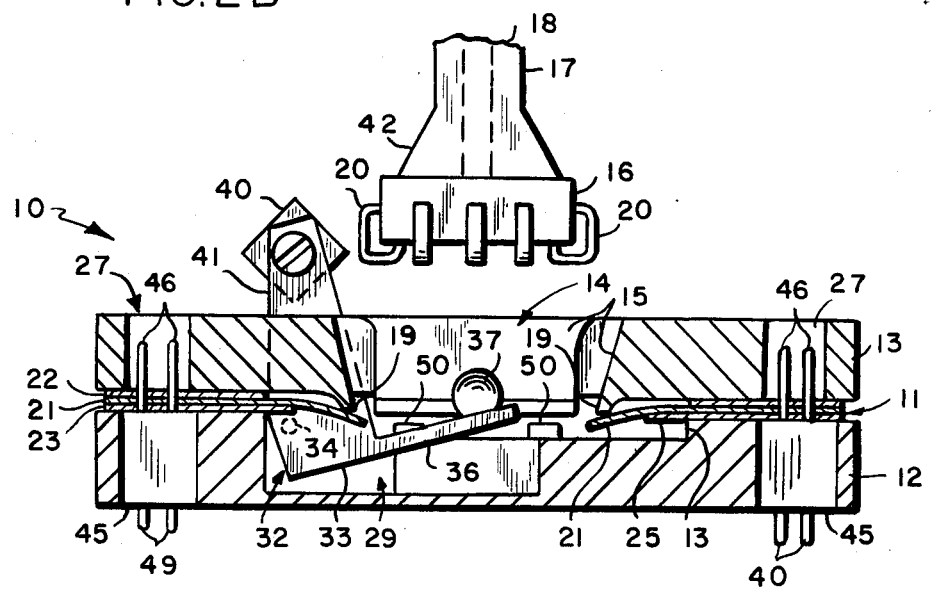

FIGS. 2A and 2B depict a test fixture 10 suitable for supporting the new contact set 11. The test fixture 10 supports the contact set 11 clamped between a lower support member 12 and an upper guide member 13. The guide member includes a central guide aperture 14 defined by a rectangular or square periphery 15, the aperture having the same size and shape as the integrated circuit packages to be tested. The guide aperture guides the movement of an integrated circuit package 16 carried by a conventional ram 17 (FIG. 2A) so that leads 20 come in contact with contact strips 21 when the ram applies the integrated circuit package 16 to fixture 10 for testing. The ram includes a central orifice 18 through which a vacuum is applied to allow the integrated circuit package 16 to be retained and moved to the test fixture, and to be removed from the test fixture when testing is completed. The use of a vacuum attachment mechanism rather than a mechanical attachment mechanism allows the guide aperture 14 to force the package 16 to move horizontally into the correct alignment with the contact member 11 when the ram 17 moves the package into the advanced test registration position with respect to the fixture 10.

With reference to FIGS. 2A and 2B, the lower support member and upper guide member also includes a plurality of test access apertures 27 in the regions corresponding to the locations of the notches 26 in the upper sheet member 22 and pin holes 28 in the contact strips 21. A test connector 45 having a plurality of upwardly-extending pins 46 is situated in each aperture 27 in the lower support member, with the pins extending through pin holes 28 in the contact strips into the apertures 27 of the upper guide member. The upper guide member may include provisions, such as holes 48 near both ends of the apertures 27, to facilitate fastening of the test connectors 45 in the fixture. In one embodiment, the test connectors are mounted onto the test fixture by means of threaded rods and nuts 47, with the rods extending through holes 48 and the nuts being threaded thereon in recesses 48 in the upper surface of the upper guide member 13. Electrical connection to the test apparatus may be made through pins 49.

In one embodiment of the fixture 10, the guide member 13 includes a downwardly depending lip 19 around the periphery 15 of the guide aperture 14. The lip 19 forces the portions of the contact member 11 in the regions near the apertures 24 downward, thereby causing the free ends of the contact strips 21 extending into the central aperture, and the tongues 25 to be curved downwardly. The tongue 25 is provided so that when the lower sheet member is stressed by the lip 19 so that the contact strips are curved downwardly, the stress concentration which would otherwise result from the edge 51 of the lower support member 12 is minimized. The curving of the contact strips 21 is provided to allow for a larger wipe of the leads of the integrated circuit package 16 on the contact strips as the ram lowers the package into its advanced test position in contact with the contact strips, allowing for a more thorough removal of any oxide which may be present thereon and ensuring that sufficient electrical contact is made between the leads and the contact strips. The curvature of the contact strips also allows for a reduction in the cyclic stress applied to the contact strips as the packages are inserted into the fixture and removed, allowing the strips to have a longer operational lifetime. A plurality of upwardly-extending posts 50 in lower support member 12 limits the downward extent of movement of the integrated circuit package 16 in fixture 10.

Fixture 10 may also include a pivotable integrated circuit package ejector 32 to help eject the integrated circuit package from the test position if the ram is unable to remove it at the end of a test, which may occur, for example, if the vacuum applied through orifice 18 were to fail. The ejector 32 is positioned in a recess 29 and includes a frame 33 with pivot members 34 extending outwardly, that is upwardly and downwardly as shown in FIG. 2B, to mate with recesses 35 in the support member 12. The frame includes two ears 41 extending upwardly through apertures 43 in the guide member 13. An ejector arm 36 projects from frame 33 and extends under the test position defined by the apertures 24 in the contact member 11. A spherical spacer 37 at the end of the arm contacts the bottom of the integrated circuit package as it is being lowered by the ram, causing frame 33 to pivot clockwise as shown in FIG. 2A. A spring (not shown) biases the ejector into the position shown in FIG. 2, that is, rotated slightly counterclockwise. When the ram moves downwardly to bring an integrated circuit into position for testing, it rotates the ejector clockwise against the spring. The clockwise rotation of the frame causes ejector rail 40 to rotate toward a side bearing surface 42 of the ram 17.

Normally, the rail stops just short of contact with this surface and, during retraction of the ram, is rotated away from this surface by the spring force on the ejector so that it need never contact the surface 42 under normal operating conditions.

In operation, to initiate a test, the ram 17 retrieves an integrated circuit package 16 from a container of such packages, the vacuum applied through orifice 18 enabling the arm to grasp the package. The ram moves the package to the test fixture 10, and lowers it toward the guide aperture 14 in guide member 13. If the package is not in the correct orientation to come into registration with the contact strips 21 as it is being lowered towards the advanced test position, the periphery 15 of the guide aperture forces the package into the correct orientation, moving it across the lower face of the ram.

As the ram advances the package to the test position, the leads 20 contact the contact strips 21 and force them to curve further slightly downwardly, the strips thereby maintaining a slight upward bias to force the strips to maintain good electrical contact with the leads 20. In addition, as the ram advances the package, the underside of the package contact spacer 37, forcing the ejector arm 36 downward and causing the ejector member 32 to pivot so that the ejector rail rotates toward the bearing surface 42 of the ram 17. The posts 50 limit the downward travel of the package in fixture 10.

After the ram advances the integrated circuit package to the test position, other equipment (not shown) in the test apparatus performs electrical tests on the circuit chip. Electrical contacts may be made through the connector 45 and contact strips 21. After the tests are completed, the ram retracts, that is, it moves upwardly as shown in FIG. 1A. At the same time, the spring rotates the ejector frame 33 in a counterclockwise direction, so that rail 40 can clear surface 42. Under normal operating conditions, the vacuum supplied through the ram is sufficient to remove the integrated circuit from the test position as the ram retracts. Under these circumstances, the arm 36 merely follows the ram for a short distance without applying any significant force to the integrated circuit. However, if the circuit is jammed in the test fixture so that the vacuum supplies insufficient force to dislodge it and remove it as the ram retracts, the ejector arm 36 will remain in its operated (that is, rotated clockwise) position, and rail 40 will remain in the path of surface 42 as the ram is withdrawn. Accordingly, surface 42 will press against rail 40 and thus apply the full force of the ram to cause rotation of arm 36 and dislodgement of the integrated circuit.

There has been described a single illustrative embodiment of this invention. It will be appreciated by those skilled in the art that the invention can be embodied in modifications having diverse basic construction and have some or all of the advantages of the invention. It is the intention of the following claims to cover all such modifications.

What is claimed as new and desired to be secured by Letters Patent of the United States is:

1. A test fixture for facilitating the connection of leads of an integrated circuit package to test apparatus, the test apparatus including ram means for supporting the integrated circuit package and for advancing it into a test position in registration with said test fixture at the beginning of a test and for retracting the integrated circuit package from said test fixture at the conclusion of the test, said test fixture comprising:

A. a contact member comprising a planar insulating flexible contact support member having a central aperture therein defined by a periphery substantially corresponding to the configuration of the integrated circuit package, said contact support member supporting a plurality of flexible contact strip means projecting beyond said periphery over said aperture in a configuration to contact the leads of the integrated circuit package when the ram means advances the integrated circuit package to the advanced test position; and B. support means for supporting said contact member at the advanced test position, said support means including a lower support member and an upper guide member, said lower support member and guide member clamping said contact member therebetween, C. said lower support member having:
  i. an upper surface for supporting said contact member with said central aperture in registration with the advanced test position, and
  ii. a test registration recess under said central aperture to allow said contact strips to flex downwardly when said ram means advances the integrated circuit package to said test position;

D. said upper guide member including:
  i. a guide aperture defined by tapered sidewalls which force the integrated circuit package horizontally into registration with said contact strips as the ram means moves the package vertically to the advanced test position, and
  ii. lip means around the periphery of said guide aperture depending therefrom to depress said contact support member and said contact strips downwardly into said recess.

2. A test fixture as defined in claim 1 wherein said contact support member includes a flexible contact support sheet underlying said contact strip means and a flexible contact retaining sheet overlying said contact strip means, said contact support sheet and said contact retaining sheet both having an aperture which in combination form said central aperture, said contact support sheet further including tongue means extending partially under said contact strip means in said central aperture.

3. A test fixture as defined in claim 1 wherein said support means further includes:

A. ejector recess means in said support means support member including means for communicating with said test registration recess; and B. ejector means including:
  (i) ejector frame means pivotably mounted in said ejector recess means;
  (ii) ejector arm means connected to said ejector frame means and extending into said test registration recess, said ejector arm means being movable by said ejector frame means between a lowered position when an integrated circuit package is in the advanced test position and a raised position; and
  (iii) camming means connected to said ejector means and configured to contact said ram means when an integrated circuit package is in the advanced test position, the ram means forcing said camming means to pivot said ejector frame means, in turn forcing said ejector arm means to raise to push the integrated circuit package from said advanced test position when the ram means retracts from the advanced test position.

* * * * *